(12) United States Patent
Shih

(10) Patent No.: US 8,022,530 B2
(45) Date of Patent: Sep. 20, 2011

(54) PACKAGE SUBSTRATE HAVING ELECTRICALLY CONNECTING STRUCTURE

(75) Inventor: Chao-Wen Shih, Hsin-chu (TW)

(73) Assignee: Unimicron Technology Corp., Taoyuan (TW)

( * ) Notice: Subject to any disclaimer, the term of this patent is extended or adjusted under 35 U.S.C. 154(b) by 231 days.

(21) Appl. No.: 12/265,305

(22) Filed: Nov. 5, 2008

(65) Prior Publication Data
US 2009/0146317 A1    Jun. 11, 2009

(30) Foreign Application Priority Data
Dec. 5, 2007    (TW) .............................. 96146237 A

(51) Int. Cl.
*H01L 23/48* (2006.01)
(52) U.S. Cl. ................ 257/693; 257/E23.141; 257/690; 257/700; 438/613
(58) Field of Classification Search ........... 257/E21.021, 257/E21.168, E23.141, 737, 738, 761–763, 257/778, 690, 693, 700; 438/597, 612, 613, 438/683, 687
See application file for complete search history.

(56) References Cited

U.S. PATENT DOCUMENTS

| 4,927,505 | A | * | 5/1990 | Sharma et al. | 205/123 |
| 6,130,141 | A | * | 10/2000 | Degani et al. | 438/455 |
| 6,376,052 | B1 | * | 4/2002 | Asai et al. | 428/209 |
| 6,740,577 | B2 | * | 5/2004 | Jin et al. | 438/612 |
| 6,927,964 | B2 | * | 8/2005 | Tong et al. | 361/104 |
| 7,087,511 | B2 | * | 8/2006 | Akram et al. | 438/612 |
| 7,535,095 | B1 | * | 5/2009 | En et al. | 257/701 |
| 2002/0111009 | A1 | * | 8/2002 | Huang et al. | 438/613 |
| 2007/0290343 | A1 | * | 12/2007 | Harada et al. | 257/737 |

* cited by examiner

*Primary Examiner* — Chris Chu
(74) *Attorney, Agent, or Firm* — Pearne & Gordon LLP

(57) ABSTRACT

A package substrate having an electrically connecting structure are provided. The package substrate include: a package substrate substance with at least a surface having a plurality of electrically connecting pads formed thereon, allowing an insulating protective layer to be formed on the surface of the package substrate substance and the electrically connecting pads and formed with a plurality of openings corresponding in position to the electrically connecting pads so as to expose a portion of the electrically connecting pads, respectively; and a metal layer provided on an exposed portion of the electrically connecting pads, walls of the openings of the insulating protective layer, and a circular portion of the insulating protective layer encircling each of the openings thereof, and provided with a slope corresponding in position to a bottom rim of each of the openings. Accordingly, solder bleeding and short circuits are prevented.

12 Claims, 3 Drawing Sheets

PACKAGE SUBSTRATE HAVING ELECTRICALLY CONNECTING STRUCTURE

BACKGROUND OF THE INVENTION

1. Field of the Invention

The present invention relates to package substrates, and more particularly, to a package substrate having an electrically connecting structure.

2. Description of the Prior Art

There are two types of semiconductor package structure, namely wire-bonding packages and flip-chip packages. In wire-bonding packages, a semiconductor chip is electrically connected to the package substrate by bonding wires. In flip-chip packages, a semiconductor chip is flip-chip mounted on the package substrate with the active surface (of the semiconductor chip) facing downward, and the semiconductor chip is electrically connected to a solder material of the package substrate via a plurality of bumps. Flip-chip packages are lightweight, thin, short, and small, because they do not use space-demanding bonding wires at all, and yet render distance of signal transmission shortened. Another advantage of flip-chip packages is that the underfill provided between the semiconductor chip and the package substrate ensures reliable bonding therebetween.

To allow the semiconductor chip-mounted package substrate of a flip-chip package to be electrically connected to an external electronic device (for example, a printed circuit board), a plurality of solder balls are implanted on the bottom surface of the package substrate.

A solder material is usually formed on electrically connecting pads (chip-mounting area) of a package substrate by a stencil printing technique described below. An insulating protective layer with a plurality of openings therein is formed on a package substrate with a completely laid out circuit. From the openings, a plurality of electrically connecting pads on the package substrate are exposed. A stencil with a plurality of openings therein is disposed on the insulating protective layer of the package substrate. Through the openings of the stencil, a solder pile is formed on the electrically connecting pads, using a squeegee blade or by spraying, as a result of accumulation of solder in the openings and subsequent removal of the stencil. Afterward, the solder pile on the electrically connecting pads is solidified by a reflow process so to form a solder structure.

Referring to FIGS. 1A and 1B, which are cross-sectional views showing a solder material formed on electrically connecting pads of a package substrate according to the prior art, a package substrate substance 10 has at least a surface 10a formed with a plurality of electrically connecting pads 11 thereon, and an insulating protective layer 12 is formed on the surface 10a and the electrically connecting pads 11. The insulating protective layer 12 has a plurality of openings 120 formed therein. The openings 120 correspond in position to the electrically connecting pads 11 so as to expose portions of the electrically connecting pads 11, respectively. A corner C with an angle of 90° approximately is formed between each of the electrically connecting pads 11 and a corresponding one of the openings 120 of the insulating protective layer 12, and thus a solder material 13 formed in the openings 120 of the insulating protective layer 12 is unlikely to be deposited at the corner C. Also, during a reflow process performed on the solder material 13, the corner C with a 90° angle cannot be fully filled with the molten solder material 13 due to cohesion and surface tension thereof, thus causing a gap S (shown in FIG. 1B) to form between the solder material 13 and the insulating protective layer 12. The gap S generates and holds air bubbles readily. As a result, a subsequent process is flawed by unreliability, for example, detachment of the solder material 13.

As mentioned earlier, the corner C between each of the electrically connecting pads 11 and each of the openings 120 of the insulating protective layer 12 cannot be fully filled with the solder material 13, and thus the area of contact between the solder material 13 and each of the electrically connecting pads 11 is unfavorably small, and in consequence the solder material 13, from which a solder structure is going to be made subsequently, is unlikely to be attached to the electrically connecting pads 11 to the detriment of the quality of solder balls and the electrical connection performance of the package substrate.

Bleeding of the solder material 13 during a reflow process is prevented solely by the solder masking characteristics of the insulating protective layer 12. However, a short circuit is readily formed because of formation of a solder bridge between the bled solder material 13 on the adjacent electrically connecting pads of a package substrate having a fine pitch as soon as the solder material 13 turns molten during the reflow process. To solve the problem, the pitch of the solder material 13 has to be widened, which means that the package substrate is no longer fine-pitch, so to speak.

In view of this, an issue that calls for an immediate solution involves eliminating known drawbacks of the prior art, namely, inefficient formation of a solder material, formation of gaps between the solder material successfully formed and the insulating protective layer, poor electrical connection between a solder structure and the package substrate, and bleeding of the solder material in a reflow process.

SUMMARY OF THE INVENTION

To overcome the aforesaid drawbacks of the prior art, it is a primary objective of the present invention to provide a package substrate having an electrically connecting structure, so as to prevent short circuits by stopping a solder material from bleeding during a reflow process.

Another objective of the present invention is to provide a package substrate having an electrically connecting structure, so as to provide a fine-pitch electrically connecting structure.

Yet another objective of the present invention is to provide a package substrate having an electrically connecting structure, so as to better bond a solder material and electrically connecting pads together and prevent detachment.

To achieve the above and other objectives, the present invention discloses a package substrate having an electrically connecting structure. The package substrate comprises: a package substrate substance with at least a surface having a plurality of electrically connecting pads formed thereon, allowing an insulating protective layer to be formed on the surface of the package substrate substance and the electrically connecting pads and formed with a plurality of openings corresponding in position to the electrically connecting pads so as to expose a portion of the electrically connecting pads, respectively; and a metal layer provided on an exposed portion of the electrically connecting pads, walls of the openings of the insulating protective layer, and a circular portion of the insulating protective layer encircling each of the openings thereof, and provided with a slope corresponding in position to a bottom rim of each of the openings.

The metal layer is made of a metal with a high melting point, such as copper (Cu), gold (Au), silver (Ag), or high lead.

The package substrate further comprises: a conductive layer formed on walls of the openings of the insulating protective layer, on a circular portion of the insulating protective layer encircling each of the openings thereof, and beneath the metal layer; and a solder material formed on the metal layer, wherein the solder material is a solder of a low melting point, such as tin/lead (Sn/Pb), tin/silver (Sn/Ag), tin/silver/copper (Sn/Ag/Cu), tin/copper (Sn/Cu), tin (Sn), or lead-free solder.

The package substrate further comprises: a surface treatment layer formed either on the metal layer or on the upper surface and side surface of the metal layer; and a solder material formed on the surface treatment layer. The surface treatment layer is made of nickel/gold (Ni/Au, forming nickel and then gold), electroless nickel and immersion gold (ENIG), electroless nickel/electroless palladium/immersion gold (ENEPIG), immersion tin (IT), or direct immersion gold (DIG). The solder material is a solder of a low melting point, such as tin/lead (Sn/Pb), tin/silver (Sn/Ag), tin/silver/copper (Sn/Ag/Cu), tin/copper (Sn/Cu), tin (Sn), or lead-free solder.

The present invention provides a package substrate having an electrically connecting structure. A metal layer is electroplated onto a plurality of electrically connecting pads, using a conductive layer as an electrical conduction path. During a reflow process, a molten solder material formed on the metal layer is stopped from flowing and thereby prevented from bleeding due to the affinity of the solder material for the metal layer and the high melting point of the metal layer, thus providing electrical connection capacity for a fine-pitch package substrate. No gap can be formed between the solder material and the sloped metal layer, and thus bonding between the solder material and the metal layer is sufficient to preclude detachment of the solder material.

DETAILED DESCRIPTION OF THE EMBODIMENTS

The present invention is herein illustrated with specific embodiments, so that one skilled in the pertinent art can easily understand other advantages and effects of the present invention from the disclosure of the invention.

FIGS. 2A to 2E are cross-sectional views showing a method of fabricating a package substrate having an electrically connecting structure according to the present invention.

Figure 1A:
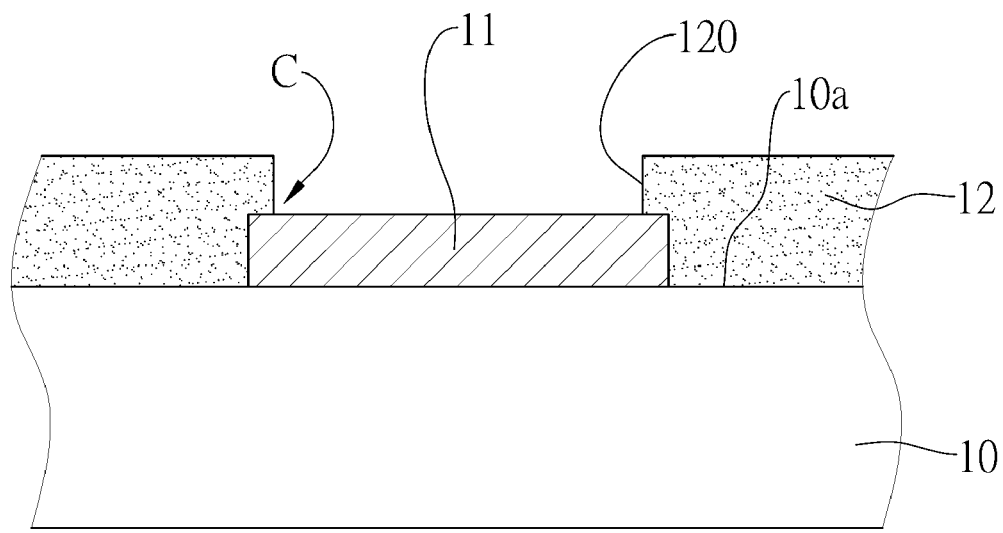
FIGS. 1A and 1B (PRIOR ART) are cross-sectional views showing a solder material formed on electrically connecting pads of a package substrate.
Figure 1B:
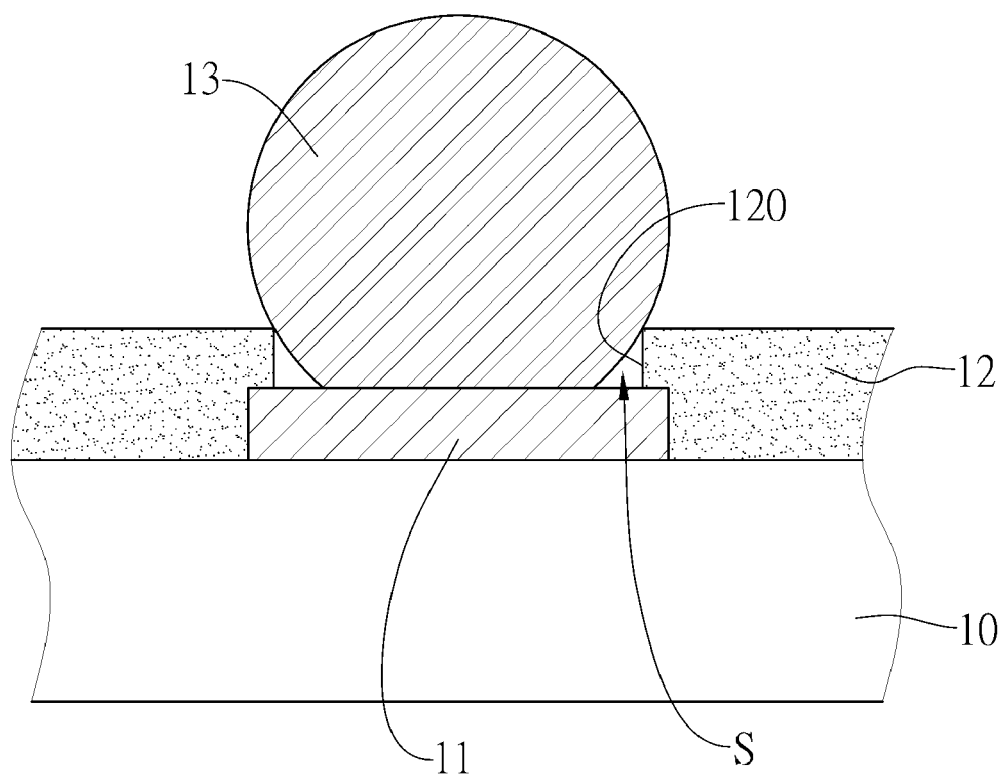
Figure 2A:
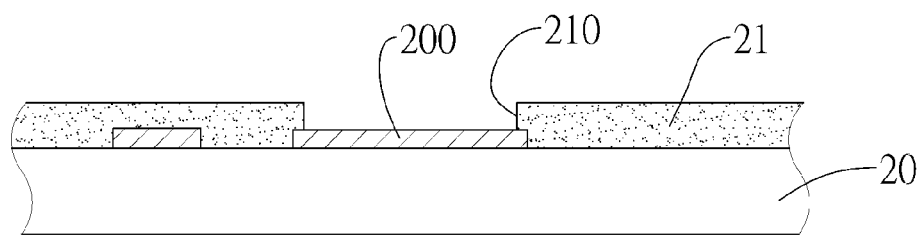
FIGS. 2A to 2E are cross-sectional views showing a method of fabricating a package substrate having an electrically connecting structure according to the present invention.

Referring to FIG. 2A, a package substrate substance 20 with at least a surface having a plurality of electrically connecting pads 200 formed thereon is provided. The package substrate substance 20 is bi-layered or tri-layered and has a finalized circuit layout. The electrically connecting pads 200 are electrically connected to an inner-layer circuit via a conductive blind via (not shown).

An insulating protective layer 21 is formed on the package substrate substance 20, by coating the package substrate substance 20 with the insulating protective layer 21 by stencil printing, spin coating, or lamination. The insulating protective layer 21, which is a solder mask layer made of a dewetting solder mask material, is patterned by exposure and development so as for a plurality of openings 210 to be formed therein and configured to expose the electrically connecting pads 200.

Figure 2B:
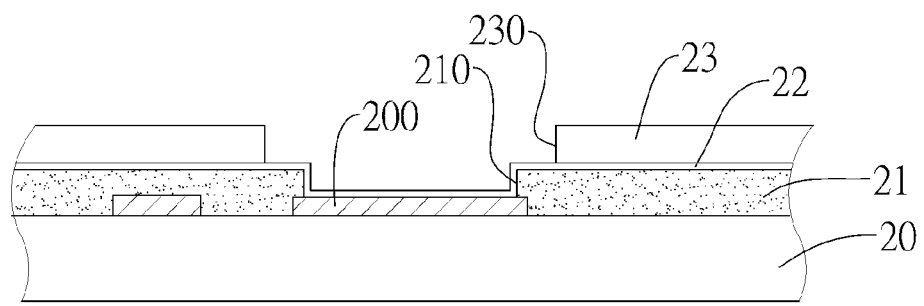

Referring to FIG. 2B, a conductive layer 22 is formed on the electrically connecting pads 200, the insulating protective layer 21, and walls of the openings 210. The conductive layer 22 which functions as an electrical conduction path required for metal electroplating is made of metal, alloy, or a plurality of deposited metal layers. Alternatively, the conductive layer 22 is made of conductive polymer. Afterward, the conductive layer 22 is covered with a resist layer 23, and then the resist layer 23 is patterned. The resist layer 23, which is a dry film photoresist or a liquid photoresist, is formed on the conductive layer 22 by stencil printing, spin coating, or lamination and then patterned by exposure and development so as for a plurality of openings 230 to be formed therein and corresponding in position to the electrically connecting pads 200. The openings 230 of the resist layer 23 are larger than the openings 210 of the insulating protective layer 21 so as to expose a portion of the conductive layer 22 corresponding in position to the electrically connecting pads 200 and a circular portion of the insulating protective layer 21 encircling each of the openings 210 thereof, respectively.

Figure 2C:
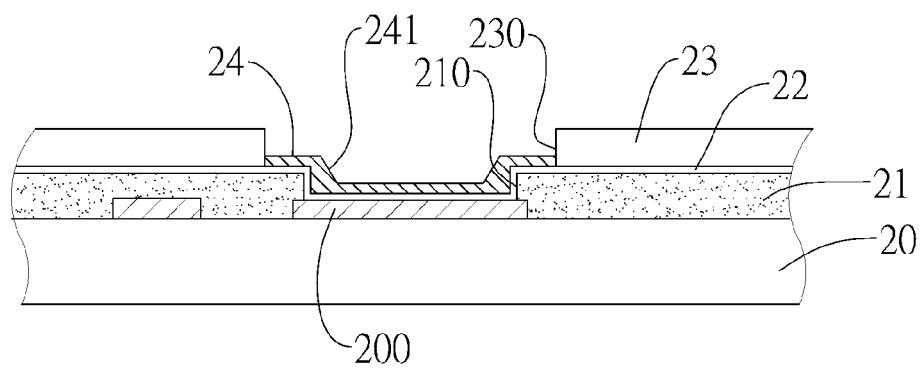

Referring to FIG. 2C, performed on the package substrate is an electroplating process whereby a metal layer 24 is electroplated to the conductive layer 22 exposed from the openings 230 of the resist layer 23, using the conductive layer 22 as the electrical conduction path. The metal layer 24 exposed from the openings of the insulating protective layer is formed with a slope 241 corresponding in position to the bottom rim of each of the openings 210 by controlling electroplating parameters, such as density of current, and electrolyte concentration, proportion, and temperature. The metal layer 24 is made of a metal with a high melting point, such as copper (Cu), gold (Au), silver (Ag), or high lead. Copper is a cheap, readily processed electroplating material in practice, and thus the metal layer 24 is preferably made of electroplated copper; however, the present invention is not limited to the disclosure.

Figure 2D:
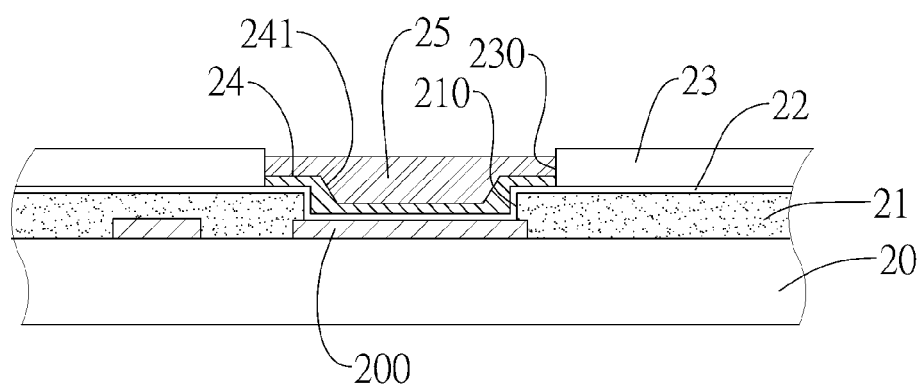

Referring to FIG. 2D, a solder material 25 is electroplated to the metal layer 24. The solder material 25, which is a solder of a low melting point, is made of tin/lead (Sn/Pb), tin/silver (Sn/Ag), tin/silver/copper (Sn/Ag/Cu), tin/copper (Sn/Cu), tin (Sn), or lead-free solder. Alternatively, the solder material 25 is formed on the metal layer 24 by stencil printing.

Figure 2E:
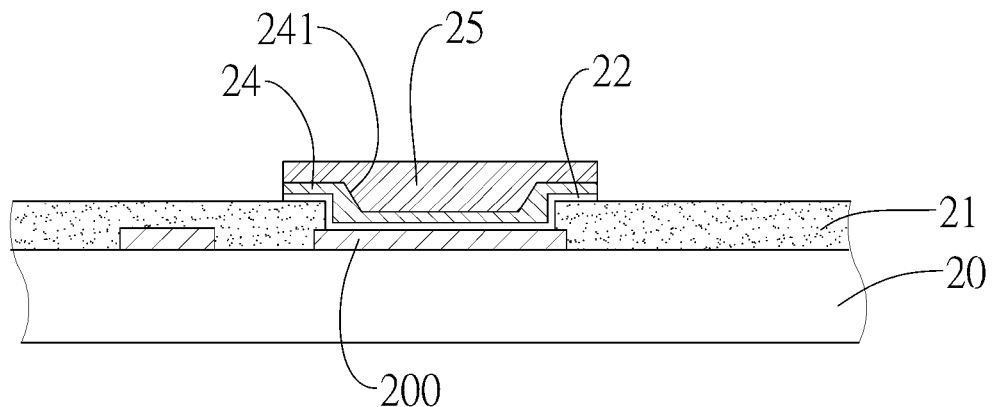

Referring to FIG. 2E, the resist layer 23 and the conductive layer 22 thereunder are removed so as to expose a portion of the metal layer 24 and a portion of the solder material 25.

Figure 3A:
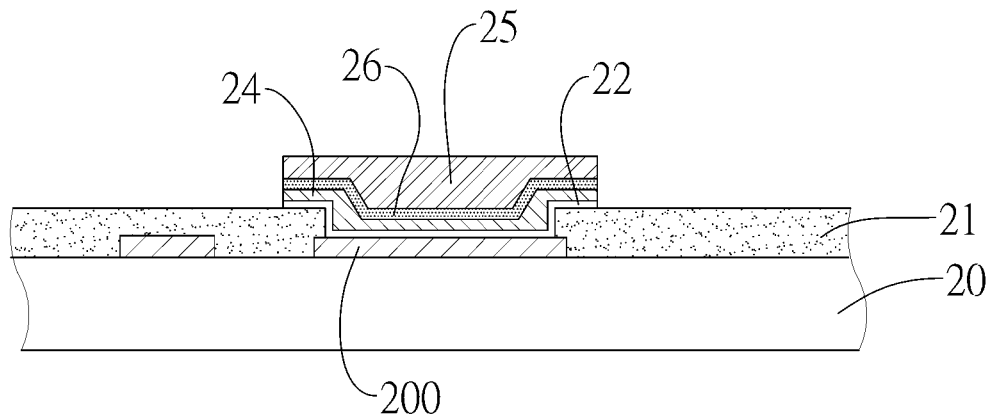
FIG. 3A is a cross-sectional view showing another embodiment of a package substrate having an electrically connecting structure according to the present invention.
Figure 3B:
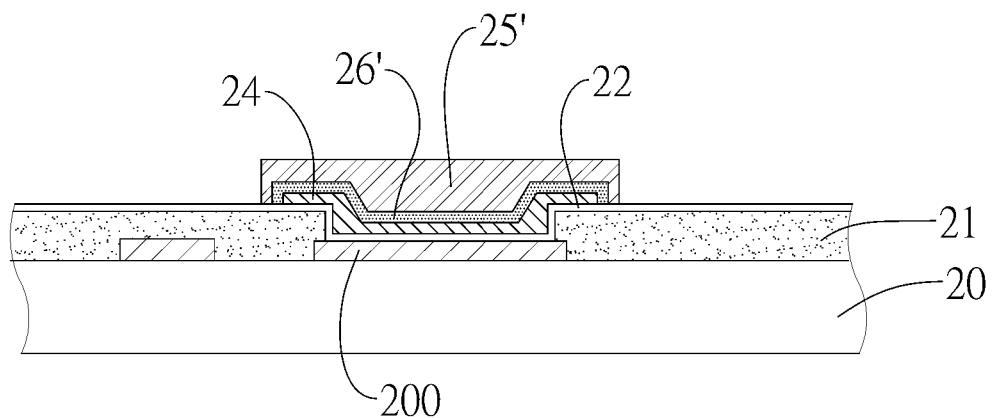
FIG. 3B is a cross-sectional view showing yet another embodiment of a package substrate having an electrically connecting structure according to the present invention.

Referring to FIGS. 3A and 3B, prior to the formation of the solder material 25, a surface treatment layer 26 is formed on the metal layer 24 by electroplating or chemical deposition, and then the solder material 25 is formed on the surface treatment layer 26 before removal of the resist layer 23 and the conductive layer 22 thereunder, as shown in FIG. 3A. Alternatively, after removal of the resist layer 23 and the conductive layer 22 thereunder, a surface treatment layer 26' is formed on the upper surface and the side surface of the metal layer 24, and then a solder material 25' is formed on the surface treatment layer 26', as shown in FIG. 3B. The surface treatment layer is made of nickel/gold (Ni/Au), electroless nickel and immersion gold (ENIG), electroless nickel/electroless palladium/immersion gold (ENEPIG), immersion tin (IT), or direct immersion gold (DIG).

Afterward, a reflow process is performed on the solder material 25, 25', such that the solder material 25, 25' and the surface treatment layer 26, 26' together form a solder ball end structure; given the solder ball end structure, the package substrate can be electrically connected to an external electronic device.

The present invention further provides a package substrate having an electrically connecting structure. The package substrate comprises: a package substrate substance 20 with at least a surface having a plurality of electrically connecting pads 200 formed thereon; an insulating protective layer 21 formed on the at least a surface of the package substrate substance 20 and the electrically connecting pads 200, wherein a plurality of openings 210 corresponding in position to the electrically connecting pads 200 are formed in the insulating protective layer 21 so as to expose a portion of the electrically connecting pads 200; and a metal layer 24 formed on the exposed portion of the electrically connecting pads 200, walls of the openings 210 of the insulating protective layer 21, and a circular portion of the insulating protective layer 21 encircling each of the openings 210 thereof, wherein the metal layer 24 exposed from the openings 210 of the insulating protective layer 21 is formed with a slope 241 corresponding in position to the bottom rim of each of the openings 210.

The package substrate further comprises a conductive layer 22 formed on the exposed portion of the electrically connecting pads 200, on walls of the openings 210 of the insulating protective layer 21, on a circular portion of the insulating protective layer 21 encircling each of the openings 210 thereof, and beneath the metal layer 24 to be formed later on.

The metal layer 24 is provided with a solder material 25 thereon, as shown in FIG. 2E. In an alternative embodiment, a surface treatment layer 26 and a solder material 25 are formed on the metal layer 24 in sequence, as shown in FIG. 3A. In another alternative embodiment, a surface treatment layer 26' is formed on the upper surface and the side surface of the metal layer 24, and then a solder material 25' is formed on the surface treatment layer 26', allowing the surface treatment layer 26' to be covered with the solder material 25', as shown in FIG. 3B.

The solder material 25, 25' is a solder of a low melting point, such as tin/lead (Sn/Pb), tin/silver (Sn/Ag), tin/silver/copper (Sn/Ag/Cu), tin/copper (Sn/Cu), tin (Sn), or lead-free solder.

The metal layer 24 is made of a metal with a high melting point, such as copper (Cu), gold (Au), silver (Ag), or high lead.

The surface treatment layer 26, 26' is made of nickel/gold (Ni/Au), electroless nickel and immersion gold (ENIG), electroless nickel/electroless palladium/immersion gold (ENEPIG), immersion tin (IT), or direct immersion gold (DIG).

A method of fabricating a package substrate having an electrically connecting structure of the present invention comprises forming, by an electroplating process, a metal layer on a plurality of electrically connecting pads, walls of a plurality of openings of an insulating protective layer, and a circular portion of the insulating protective layer encircling each of the openings thereof, using a conductive layer as an electrical conduction path, wherein the metal layer exposed from the openings of the insulating protective layer is formed with a slope, so as to prevent the solder material formed on the metal layer from bleeding during a reflow process, protect a fine-pitch package substrate against short circuits, and bond the metal layer and the solder material together better so as to prevent detachment of the solder material.

The foregoing specific embodiments are only illustrative of the features and functions of the present invention but are not intended to restrict the scope of the present invention. It is apparent to those skilled in the art that all equivalent modifications and variations made in the foregoing embodiment according to the spirit and principle in the disclosure of the present invention should fall within the scope of the appended claims.

What is claimed is:

1. A package substrate having an electrically connecting structure, comprising:
a package substrate substance with at least a surface having a plurality of electrically connecting pads formed thereon and having an insulating protective layer, allowing the insulating protective layer to be formed on the electrically connecting pads and formed with a plurality of openings corresponding in position to the electrically connecting pads so as to expose the electrically connecting pads, respectively, wherein the package substrate substance is made of an organic or ceramic material, and the insulating protective layer is an outmost layer of the package substrate substance; and
a silver metal layer provided on an exposed portion of the electrically connecting pads, walls of the openings of the insulating protective layer, and a rim portion of the insulating protective layer encircling each of the openings thereof, wherein the silver metal layer is formed with a slope toward a bottom end of each of the openings and a bottom of the silver metal layer on the bottom end of each of the openings, such that the bottom of the silver metal layer is completely lower than a top end of each of the openings of the insulating protective layer.

2. The package substrate having an electrically connecting structure of claim 1, further comprising a conductive layer provided on the exposed portion of the electrically connecting pads, on the walls of the openings of the insulating protective layer, on the rim portion of the insulating protective layer encircling each of the openings thereof, and beneath the silver metal layer.

3. The package substrate having an electrically connecting structure of claim 1, further comprising a solder material provided on the silver metal layer.

4. The package substrate having an electrically connecting structure of claim 3, wherein the solder material is a low-melting-point solder selected from the group consisting of tin/lead (Sn/Pb), tin/silver (Sn/Ag), tin/silver/copper (Sn/Ag/Cu), tin/copper (Sn/Cu), tin (Sn), and lead-free solder.

5. The package substrate having an electrically connecting structure of claim 1, further comprising a surface treatment layer provided on the silver metal layer.

6. The package substrate having an electrically connecting structure of claim 5, wherein the surface treatment layer is made of one selected from the group consisting of nickel/gold (Ni/Au), electroless nickel and immersion gold (ENIG), electroless nickel/electroless palladium/immersion gold (ENEPIG), immersion tin (IT), and direct immersion gold (DIG).

7. The package substrate having an electrically connecting structure of claim 5, further comprising a solder material covering the surface treatment layer.

8. The package substrate having an electrically connecting structure of claim 7, wherein the solder material is a low-melting-point solder selected from the group consisting of tin/lead (Sn/Pb), tin/silver (Sn/Ag), tin/silver/copper (Sn/Ag/Cu), tin/copper (Sn/Cu), tin (Sn), and lead-free solder.

9. The package substrate having an electrically connecting structure of claim 1, further comprising a surface treatment layer provided on an upper surface and a side surface of the silver metal layer.

10. The package substrate having an electrically connecting structure of claim 9, wherein the surface treatment layer is made of one selected from the group consisting of nickel/gold (Ni/Au), electroless nickel and immersion gold (ENIG), electroless nickel/electroless palladium/immersion gold (ENEPIG), immersion tin (IT), and direct immersion gold (DIG).

11. The package substrate having an electrically connecting structure of claim 9, further comprising a solder material covering the surface treatment layer.

12. The package substrate having an electrically connecting structure of claim 11, wherein the solder material is a low-melting-point solder selected from the group consisting of tin/lead (Sn/Pb), tin/silver (Sn/Ag), tin/silver/copper (Sn/Ag/Cu), tin/copper (Sn/Cu), tin (Sn), and lead-free solder.

* * * * *